(12) United States Patent
Zhang

(10) Patent No.: US 10,181,793 B2
(45) Date of Patent: Jan. 15, 2019

(54) CONTROL CIRCUIT FOR BUCK-BOOST POWER CONVERTER WITH STABLE BOOTSTRAP VOLTAGE REFRESH

(71) Applicant: Chengdu Monolithic Power Systems Co., Ltd., Chengdu (CN)

(72) Inventor: Jian Zhang, Chengdu (CN)

(73) Assignee: Chengdu Monolithic Power Systems Co., Ltd., Chengdu (CN)

(*) Notice: Subject to any disclaimer, the term of this patent is extended or adjusted under 35 U.S.C. 154(b) by 0 days.

(21) Appl. No.: 15/668,674

(22) Filed: Aug. 3, 2017

(65) Prior Publication Data

US 2018/0041126 A1 Feb. 8, 2018

(30) Foreign Application Priority Data

Aug. 8, 2016 (CN) .......................... 2016 1 0642872

(51) Int. Cl.
*H02M 3/158* (2006.01)
*H02M 1/08* (2006.01)
*H03K 5/1536* (2006.01)
*H02M 3/156* (2006.01)
*H02M 1/00* (2006.01)

(52) U.S. Cl.
CPC ......... *H02M 3/1582* (2013.01); *H02M 1/083* (2013.01); *H03K 5/1536* (2013.01); *H02M 3/156* (2013.01); *H02M 2001/0003* (2013.01); *H02M 2001/0032* (2013.01)

(58) Field of Classification Search
CPC ............... H02M 3/156; H02M 3/1582; H02M 2001/0032; H02M 2001/0035; H02M 1/083

USPC ........................................ 323/259, 282, 344
See application file for complete search history.

(56) References Cited

U.S. PATENT DOCUMENTS

| | | | | |
|---|---|---|---|---|
| 8,981,737 B2* | 3/2015 | Huang | ................ | H02M 3/1582 323/259 |
| 2008/0169796 A1* | 7/2008 | Buethker | ............ | H02M 3/1582 323/282 |
| 2009/0102441 A1* | 4/2009 | de Cremoux | ....... | H02M 3/1582 323/271 |
| 2012/0229110 A1* | 9/2012 | Huang | ................ | H02M 3/1582 323/282 |
| 2015/0311795 A1* | 10/2015 | Yang | ..................... | H02M 3/156 323/271 |
| 2017/0257031 A1* | 9/2017 | Shao | ................... | H02M 3/1582 |

* cited by examiner

*Primary Examiner* — Alex Torres-Rivera
(74) *Attorney, Agent, or Firm* — Perkins Coie LLP

(57) ABSTRACT

A buck-boost power converter and a control circuit for the buck-boost converter. The buck-boost power converter includes a first power switch and a second power switch coupled in series between an input port and a reference ground, and a third power switch and a fourth power switch coupled in series between an output port and the reference ground. The control circuit receives a pulse skipping control signal and a zero-crossing indication signal, and controls the second power switch and/or the third power switch to turn on when the pulse skipping control signal controls the buck-boost power converter to enter into a pulse skipping mode and the zero-crossing indication signal indicates that an output inductor current of the buck-boost power converter crosses zero.

15 Claims, 4 Drawing Sheets

CONTROL CIRCUIT FOR BUCK-BOOST POWER CONVERTER WITH STABLE BOOTSTRAP VOLTAGE REFRESH

CROSS REFERENCE

This application claims the benefit of CN application No. 201610642872.7 filed on Aug. 8, 2016 and incorporated herein by reference.

TECHNICAL FIELD

This disclosure relates generally to buck-boost power converters, and more particularly but not exclusively relates to control circuit of buck-boost power converters.

BACKGROUND

Buck-boost power converters can convert an input voltage into an output voltage higher than, equal to or lower than the input voltage and can generally be operated with wide input voltage range. Therefore, buck-boost power converters are widely used in power management applications.

FIG. 1 illustrates a topology 10 of the power switches of a conventional buck-boost power converter. The topology 10 comprises a first power switch SWA, a second power switch SWB, a third power switch SWC and a fourth power switch SWD. The first power switch SWA and the second power switch SWB are coupled in series between an input port IN and a reference ground GND, and have a common connection SW1 referred to as a first switching node SW1. The third power switch SWC and the fourth power switch SWD are coupled in series between an output port OUT and the reference ground GND, and have a common connection SW2 referred to as a second switching node SW2. An inductor L is coupled between the first switching node SW1 and the second switching node SW2. The buck-boost power converter typically further comprises a control circuit to provide driving signals DR1, DR2, DR3 and DR4 respectively to the control terminals GA, GB, GC and GD of the power switches SWA, SWB, SWC and SWD to control the on and off switching of the power switches SWA, SWB, SWC and SWD so as to converter an input voltage Vin at the input port IN to an appropriate output voltage Vo at the output port OUT.

The control circuit typically comprises drivers to respectively drive the power switches SWA, SWB, SWC and SWD. For instance, a driver DRA to drive the first power switch SWA and a driver DRD to drive the fourth power switch SWD are illustrated in FIG. 1. If the first power switch SWA and the fourth power switch SWD are N channel power switching devices (e.g. N channel field effect transistors, N channel double diffused metal oxide semiconductor transistors etc.), bootstrap circuits should be provided to enhance the driving capability of the drivers DRA and DRD. For example, in FIG. 1, a first bootstrap capacitor CB1 coupled between a first bootstrap terminal BST1 and the first switching node SW1 and a second bootstrap capacitor CB2 coupled between a second bootstrap terminal BST2 and the second switching node SW2 are shown. The first bootstrap capacitor CB1 and the second bootstrap capacitor CB2 are respectively configured to generate a first bootstrap voltage VBST1 referenced with the voltage at the first switching node SW1 and a second bootstrap voltage VBST2 referenced with the voltage at the second switching node SW2. The first bootstrap voltage VBST1 and the second bootstrap voltage VBST2 are respectively used to enhance the driving capability of the driving signals DR1 and DR4 output from the drivers DRA and DRD to fully turn the first power switch SWA and the fourth power switch SWD on/off.

The first bootstrap voltage VBST1 and the second bootstrap voltage VBST2 can be respectively generated through charging the first bootstrap capacitor CB1 and the second bootstrap capacitor CB2. However, under certain operation conditions, such as when the buck-boost power converter operates under light load or no-load condition, charges on the first bootstrap capacitor CB1 and the second bootstrap capacitor CB2 may not be enough, leading to decrease in the first bootstrap voltage VBST1 and the second bootstrap voltage VBST2 to the extent that may not be able to drive the first power switch SWA and the fourth power switch SWD to switch on/off normally. Therefore, when the first bootstrap voltage VBST1 and the second bootstrap voltage VBST2 is lower than a predetermined threshold, the first bootstrap voltage VBST1 and the second bootstrap voltage VBST2 should be refreshed i.e. the first bootstrap voltage VBST1 and the second bootstrap voltage VBST2 should be charged (e.g. through charging the first bootstrap capacitor CB1 and the second bootstrap capacitor CB2) to recover to a desired bootstrap voltage value.

In pulse skipping mode, when an inductor current IL flowing through the inductor L crosses zero, the power switches SWA, SWB, SWC and SWD are typically all switched off. For this situation, the voltage at the first switching node SW1 and the voltage at the second switching node SW2 will be oscillating or floating e.g. at a high potential as the input voltage Vin or a low potential as the reference ground GND. If the first bootstrap voltage VBST1 and the second bootstrap voltage VBST2 just happen needing to be refreshed in this situation, for instance be refreshed with the bootstrap refresh scheme taught in patent ZL201210315162.5, the voltage at the first switching node SW1 and the voltage at the second switching node SW2 will oscillate at a high frequency, leading to failure in refreshing the first bootstrap voltage VBST1 and the second bootstrap voltage VBST2 and disturbance in the output voltage Vo of the buck-boost power converter. FIG. 2 illustrates a waveform diagram showing simulation waveforms of the output voltage Vo, the inductor current IL, the voltage VSW1 at the first switching node SW1 and the voltage VSW2 at the second switching node SW2 when refreshing the bootstrap voltages VBST1 and VBST2 in the pulse skipping mode under the circumstance when the inductor current IL crosses zero and the power switches SWA, SWB, SWC and SWD are all switched off. It can be seen from FIG. 2 that under this circumstance, oscillation occurs in the voltage at the first switching node SW1 and in the voltage at the second switching node SW2, leading to disturbance in the output voltage Vo of the buck-boost power converter.

SUMMARY

In accomplishing the above and other objects, there has been provided, in accordance with an embodiment of the present disclosure, a control circuit for a buck-boost power converter.

The buck-boost power converter may include a first power switch and a second power switch coupled in series between an input port and a reference ground and a third power switch and a fourth power switch coupled in series between an output port and the reference ground.

The control circuit comprises a logic control module that may receive a pulse skipping control signal and a zero-crossing indication signal, and control the second power switch to turn on or to control the third power switch to turn on or to control both the second power switch and the third power switch to turn on when the pulse skipping control signal controls the buck-boost power converter to enter into a pulse skipping mode and the zero-crossing indication signal indicates that an output inductor current of the buck-boost power converter crosses zero. The output inductor current flows through an inductive energy storage component coupled between a common connection of the first power switch and the second power switch and a common connection of the third power switch and the fourth power switch.

The control circuit further comprises: a pulse skipping control module configured to receive a load indication signal indicative of the load status of the buck-boost power converter, and to compare the load indication signal with a pulse skipping threshold to provide the pulse skipping control signal, wherein the pulse skipping control signal is configured to control the buck-boost power converter to enter into the pulse skipping mode when the load indication signal is lower than the pulse skipping threshold.

The control circuit further comprises: a zero cross detection module configured to compare an inductor current indication signal indicative of the output inductor current with a zero-crossing threshold to provide the zero-crossing indication signal, wherein the zero-crossing indication signal indicates that the output inductor current crosses zero when the inductor current indication signal reaches the zero-crossing threshold.

There has been provided, in accordance with an embodiment of the present disclosure, a buck-boost power converter comprising the control circuit. The buck-boost power converter further comprises a bootstrap circuit including a first bootstrap capacitor and a second bootstrap capacitor, wherein the first bootstrap capacitor is coupled between a first bootstrap terminal and the common connection of the first power switch and the second power switch, and wherein the second bootstrap capacitor is coupled between a second bootstrap terminal and the common connection of the third power switch and the fourth power switch.

There has been provided, in accordance with an embodiment of the present disclosure, a method for controlling the buck-boost converter. The method comprises: determining whether the buck-boost power converter enters into a pulse skipping mode; determining whether an inductor current through an output inductive energy storage component of the buck-boost power converter crosses zero; and turning the second power switch and/or the third power switch on when the buck-boost power converter enters into the pulse skipping mode and the inductor current crosses zero.

BRIEF DESCRIPTION OF THE DRAWINGS

The following detailed description of various embodiments of the present invention can best be understood when read in conjunction with the following drawings, in which the features are not necessarily drawn to scale but rather are drawn as to best illustrate the pertinent features.

The use of the same reference label in different drawings indicates the same or like components or structures with substantially the same functions for the sake of simplicity.

DETAILED DESCRIPTION

Various embodiments of the present invention will now be described. In the following description, some specific details, such as example circuits and example values for these circuit components, are included to provide a thorough understanding of embodiments. One skilled in the relevant art will recognize, however, that the present invention can be practiced without one or more specific details, or with other methods, components, materials, etc. In other instances, well-known structures, materials, processes or operations are not shown or described in detail to avoid obscuring aspects of the present invention.

Throughout the specification and claims, the term "coupled," as used herein, is defined as directly or indirectly connected in an electrical or non-electrical manner. The terms "a," "an," and "the" include plural reference, and the term "in" includes "in" and "on". The phrase "in one embodiment," as used herein does not necessarily refer to the same embodiment, although it may. The term "or" is an inclusive "or" operator, and is equivalent to the term "and/or" herein, unless the context clearly dictates otherwise. The term "based on" is not exclusive and allows for being based on additional factors not described, unless the context clearly dictates otherwise. The term "circuit" means at least either a single component or a multiplicity of components, either active and/or passive, that are coupled together to provide a desired function. The term "signal" means at least one current, voltage, charge, temperature, data, or other signal. Where either a field effect transistor ("FET") or a bipolar junction transistor ("BJT") may be employed as an embodiment of a transistor, the scope of the words "gate", "drain", and "source" includes "base", "collector", and "emitter", respectively, and vice versa. Those skilled in the art should understand that the meanings of the terms identified above do not necessarily limit the terms, but merely provide illustrative examples for the terms.

Figure 1:
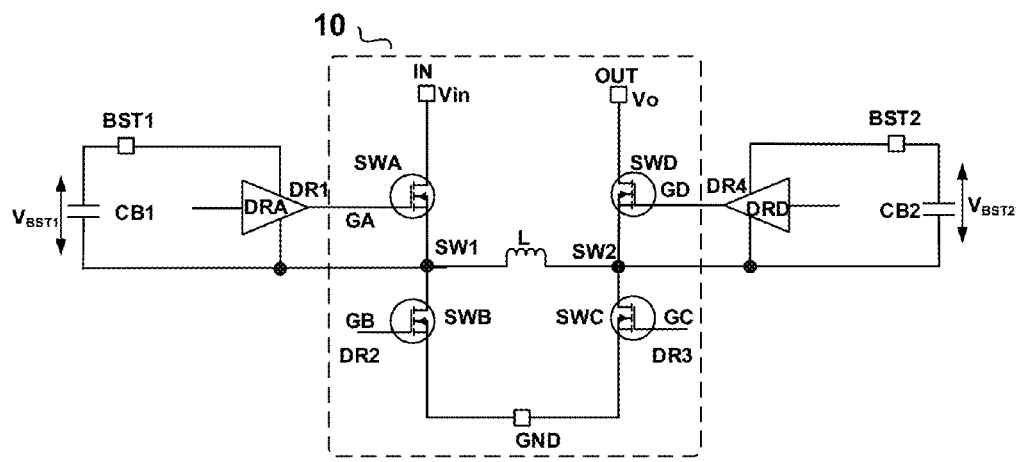
FIG. 1 illustrates a topology 10 of the power switches of a conventional buck-boost power converter.
Figure 2:
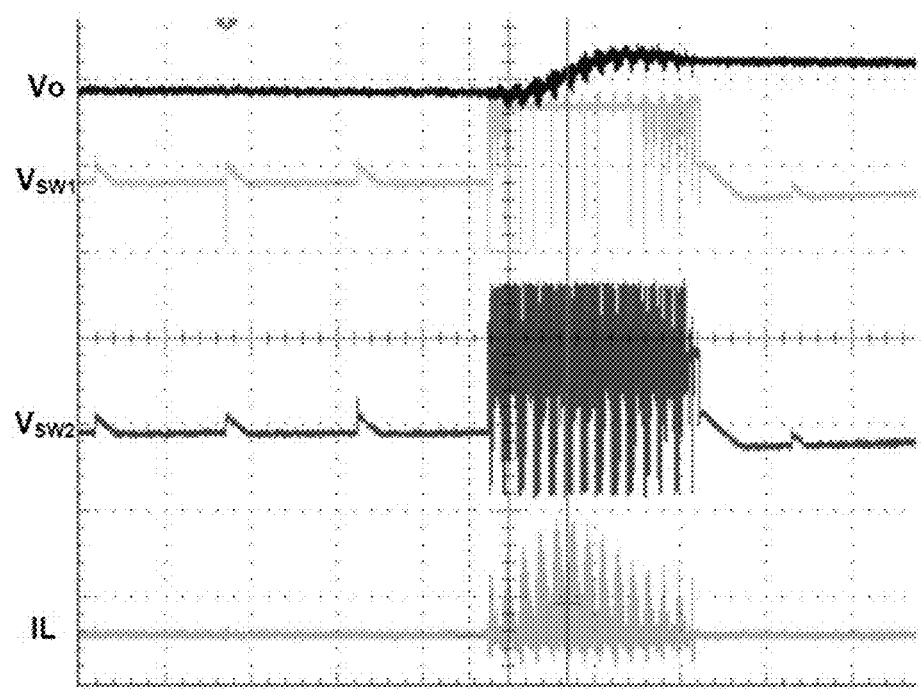
FIG. 2 illustrates a waveform diagram showing simulation waveforms of the output voltage Vo, the inductor current IL, the voltage at the first switching node SW1 and the voltage at the second switching node SW2 when refreshing the bootstrap voltages VBST1 and VBST2 in the pulse skipping mode under the circumstance when the inductor current IL crosses zero and the power switches SWA, SWB, SWC and SWD are all switched off.
Figure 3:
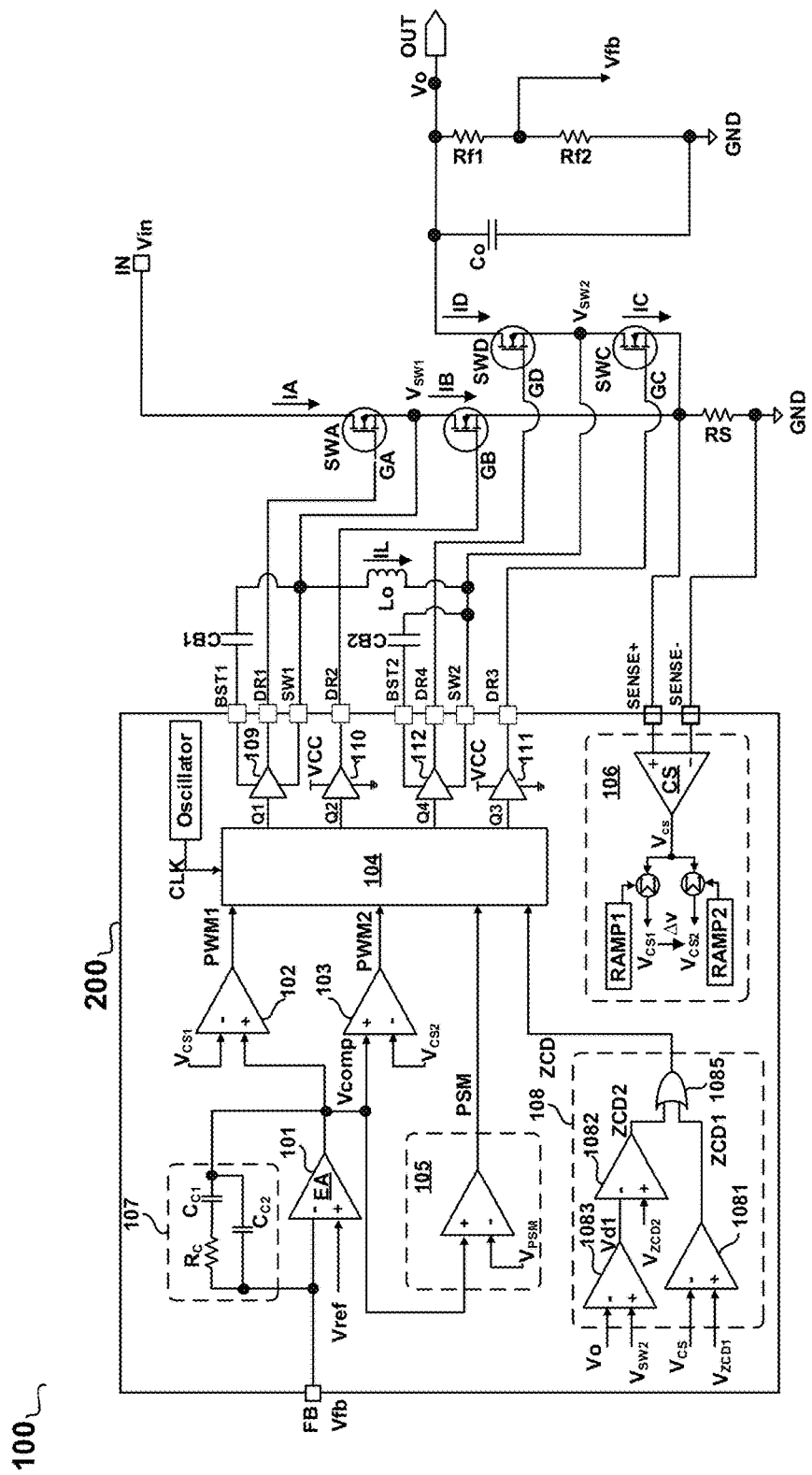
FIG. 3 illustrates a schematic diagram of a buck-boost power converter 100 and a control circuit 200 in accordance with an exemplary embodiment of the present invention.

FIG. 3 illustrates a schematic diagram of a buck-boost power converter 100 and a control circuit 200 in accordance with an exemplary embodiment of the present invention. The buck-boost power converter 100 may be configured to receive an input voltage Vin at an input port IN and to provide an output voltage Vo and an output current Io for supplying a load at an output port OUT. The buck-boost power converter 100 may comprise a switch module, e.g. including a first power switch SWA, a second power switch SWB, a third power switch SWC and a fourth power switch SWD. The switch module may have a first terminal coupled to the input port IN, a second terminal coupled to the output port OUT, and a plurality of control terminals (e.g. a first control terminal GA, a second control terminal GB, a third control terminal GC and a fourth control terminal GD illustrated in FIG. 3) configured to respectively receive a plurality of control signals (e.g. a first control signal DR1, a second control signal DR2, a third control signal DR3 and a fourth control signal DR4 illustrated in FIG. 3). The switch module is configured to conduct ON and OFF switching based on the plurality of control signals to convert the input voltage Vin into the output voltage Vo. The buck-boost power converter 100 may further comprise a control circuit 200 configured to detect/receive a first feedback signal Vfb indicative of the output voltage Vo, a second feedback signal Vcs indicative of the output current Io and a reference signal Vref indicative of a desired value of the output voltage Vo. The control circuit 200 is configured to provide the plurality of control signals (e.g. including the first control signal DR1, the second control signal DR2, the third control signal DR3 and the fourth control signal DR4 illustrated in FIG. 2) to the switch module at least partially based on the first feedback signal Vfb, the second feedback signal Vcs and the reference signal Vref.

In accordance with an exemplary embodiment of the present invention, still referring to FIG. 3, the switch module of the buck-boost power converter 100 may have a topology having the first power switch SWA and the second power switch SWB coupled in series between the input port IN and a reference ground GND, and the third power switch SWC and the fourth power switch SWD coupled in series between the output port OUT and the reference ground GND, wherein the first power switch SWA and the second power switch SWB have a common connection SW1 referred to as a first switching node SW1, and the third power switch SWC and the fourth power switch SWD have a common connection SW2 referred to as a second switching node SW2. In an exemplary embodiment, an inductive energy storage component Lo is coupled between the first switching node SW1 and the second switching node SW2. In an exemplary embodiment, the first to fourth power switches SWA, SWB, SWC and SWD may comprise controllable switching components, such as metal oxide semiconductor field effect transistors (MOSFETs) as shown in FIG. 3. The first to fourth power switches SWA, SWB, SWC and SWD may respectively have their own control terminals, such as the first control terminal GA, the second control terminal GB, the third control terminal GC and the fourth control terminal GD illustrated in FIG. 3, to respectively receive the first control signal DR1, the second control signal DR2, the third control signal DR3 and the fourth control signal DR4.

In accordance with an embodiment of the present invention, the buck-boost power converter 100 may further comprise a capacitive energy storage component Co coupled between the output port OUT and the reference ground GND. The capacitive energy storage component Co is configured to filter the output signals of the switch module, e.g. to filter a first switching voltage VSW1 output at the first switching node SW1 and a second switching voltage VSW2 output at the second switching node SW2 to smooth the output voltage Vo.

In accordance with an embodiment of the present invention, the buck-boost power converter 100 may further comprise a feedback circuit coupled to the output port OUT and configured to detect the output voltage Vo to provide the first feedback signal Vfb. In FIG. 3, the feedback circuit is illustrated to comprise a first feedback resistor Rf1 and a second feedback resistor Rf2 connected in series between the output port OUT and the reference ground GND. The first feedback signal Vfb is provided from the common connection of the first feedback resistor Rf1 and the second feedback resistor Rf2. In other embodiments, the feedback circuit may comprise other circuit elements. In certain embodiment, the power converter 100 may not comprise the feedback circuit and the output voltage Vo may be provided as the first feedback signal Vfb.

In accordance with an embodiment of the present invention, the buck-boost power converter 100 may further comprise a bootstrap circuit configured to provide a first bootstrap voltage VBST1 and a second bootstrap voltage VBST2 respectively used to enhance the driving capability of the first driving signal DR1 and the fourth driving signal DR4 output from the drivers DRA and DRD to fully turn the first power switch SWA and the fourth power switch SWD on/off. For example, in FIG. 3, a first bootstrap capacitor CB1 coupled between a first bootstrap terminal BST1 and the first switching node SW1 and a second bootstrap capacitor CB2 coupled between a second bootstrap terminal BST2 and the second switching node SW2 are shown. The first bootstrap capacitor CB1 and the second bootstrap capacitor CB2 are respectively configured to generate the first bootstrap voltage VBST1 referenced with the first switching signal VSW1 at the first switching node SW1 and the second bootstrap voltage VBST2 referenced with the second switching signal VSW2 at the second switching node SW2.

In accordance with an exemplary embodiment of the present invention, the control circuit 200 adopts peak current control pulse width modulation mode or constant on time control mode to control the ON and OFF switching of the switch module of the buck-boost power converter 100 when the load is normal or heavy. In an embodiment, the control circuit 200 further adopts pulse skipping mode to control the ON and OFF switching of the switch module of the buck-boost power converter 100 when the load is light or empty. the control circuit 200 is configured to at least provide the first control signal DR1, the second control signal DR2, the third control signal DR3 and the fourth control signal DR4 respectively to the first power switch SWA, the second power switch SWB, the third power switch SWC and the fourth power switch SWD. The first power switch SWA and the second power switch SWB form a first switch pair (also referred to as a buck switch pair). The third power switch SWC and the fourth power switch SWD form a second switch pair (also referred to as a boost switch pair). The control circuit 200 is configured to control the first switch pair and the second switch pair to conduct ON and OFF switching independently. The control circuit 200 can regulate the buck-boost power converter 100 to at least operate in one of a buck mode (when the input voltage Vin is higher than the output voltage Vo), a boost mode (when the input voltage Vin is lower than the output voltage Vo) and a buck-boost mode (when the input voltage Vin is equal or very close to the output voltage Vo) according to the relative value of the input voltage Vin and the output voltage Vo.

In accordance with an exemplary embodiment of the present invention, the second feedback signal Vcs fed to the control circuit 200 can be obtained by sensing a switching current flowing through the switch module (the first power switch SWA, the second power switch SWB, the third power switch SWC or the fourth power switch SWD) or by sensing an inductor current IL flowing through the inductive energy storage component Lo. Thus, the second feedback signal Vcs is proportional to the switching current or to the inductor current IL and carries a real-time information of the switching current or the inductor current IL. In the embodiment shown in FIG. 3, the control circuit 200 is configured to sense the switching current IB flowing through the second power switch SWB or the switching current IC flowing through the third power switch SWC to get the second feedback signal Vcs.

In accordance with an exemplary embodiment of the present invention, the control circuit 200 is configured to determine whether the buck-boost power converter 100 enters into the pulse skipping mode based on comparing a pulse skipping threshold with a difference between the first feedback signal Vfb and the reference signal Vref. In an embodiment, the pulse skipping threshold may have a predetermined constant threshold value. In an alternative embodiment, the pulse skipping threshold may have an adaptive threshold value and may be output from other circuit module(s), for instance, output from an advanced asynchronous modulation ("AAM") module. One of ordinary skill in the art should understand that this is just to provide an example, in other embodiment, the control circuit 200 may adopt other technical scheme to determine whether the buck-boost power converter 100 enters into pulse skipping mode. In accordance with an exemplary embodiment, the control circuit 200 is further configured to determine whether the inductor current IL of the buck-boost power converter 100 crosses zero based on comparing the second feedback signal Vcs with a zero-crossing threshold. Those of ordinary skill in the art would understand that the zero-crossing threshold can be zero or very close to zero (for instance, a zero-crossing threshold very close to zero within an acceptable error margin with offset/mismatch of circuit elements considered).

In accordance with an exemplary embodiment of the present invention, the control circuit 200 is configured to turn on the second power switch SWB and/or the third power switch SWC when the buck-boost power converter 100 is in the pulse skipping mode and the inductor current IL crosses zero. In this fashion, once the inductor current IL crosses zero in the pulse skipping mode, the first switching voltage VSW1 and the second switching voltage VSW2 are pulled to a low potential (e.g. the reference ground GND potential) so that the first bootstrap capacitor CB1 and the second bootstrap capacitor CB2 can be charged promptly to ensure the first bootstrap voltage VBST1 and the second bootstrap voltage VBST2 to be refreshed promptly and maintained higher than a minimum acceptable bootstrap threshold. For this situation, since the first switching voltage VSW1 at the first switching node SW1 and the second switching voltage VSW2 at the second switching node SW2 are pulled to the low potential which is stable, charging the first bootstrap capacitor CB1 and the second bootstrap capacitor CB2 does not result in oscillation in the first switching voltage VSW1 and the second switching voltage VSW2. Therefore, the control circuit 200 in accordance with various embodiments of the present invention can not only promptly refresh the first bootstrap voltage VBST1 and the second bootstrap voltage VBST2, but also keep the output voltage Vo of the buck-boost power converter 100 stable.

In the following, more detailed descriptions will be provided to the buck-boost power converter 100 and the control circuit 200 with reference to FIG. 3 and FIG. 4.

In accordance with an embodiment of the present invention, the control circuit 200 may be a monolithic integrated circuit ("IC"). The control circuit 200 may comprise a system operational amplifier 101 configured to receive the first feedback signal Vfb and the reference signal Vref respectively, and further configured to conduct operation to the first feedback signal Vfb and the reference signal Vref to provide an amplified difference signal Vcomp indicative of a difference between the first feedback signal Vfb and the reference signal Vref.

The control circuit 200 may further comprise a current sensing and compensation module 106 configured to sense the switching current flowing through the switch module (e.g. illustrated in FIG. 3 as to sense the switching current IB flowing through the second power switch SWB or the switching current IC flowing through the third power switch SWC) or the inductor current IL to generate the second feedback signal Vcs, and further configured to compensate the second feedback signal Vcs by slope compensation scheme to generate a first current sensing signal VCS1 and a second current sensing signal VCS2. The first current sensing signal VCS1 is indicative of the inductor current IL during the buck-boost power converter 100 is operated in the buck mode/buck cycle while the second current sensing signal VCS2 is indicative of the inductor current IL during the buck-boost power converter 100 is operated in the boost mode/boost cycle. In the exemplary embodiment of FIG. 3, the current sensing and compensation module 106 is illustrated to generate the second feedback signal Vcs by sensing the switching current IC flowing through the third power switch SWC. A current sensing resistor RS and a current sensing amplifier CS may be used to implement this function, as shown in FIG. 3, the current sensing resistor RS may be provided from outside of the control circuit 200 and be coupled in series with the third power switch SWC, and a first input terminal and a second input terminal of the current sensing amplifier CS are respectively coupled to a first terminal and a second terminal of the current sensing resistor RS. The current sensing amplifier CS outputs the second feedback signal Vcs. One of ordinary skill in the art should understand that this is not intended to be limiting, other circuits/elements may be used to fulfill the current sensing function. The current sensing and compensation module 106 may further be configured to receive a first slope compensation signal RAMP1 and a second slope compensation signal RAMP2, and to compensate the second feedback signal Vcs respectively by the first slope compensation signal RAMP1 and the second slope compensation signal RAMP2 to respectively generate the first current sensing signal VCS1 and the second current sensing signal VCS2. In an embodiment, the second slope compensation signal RAMP2 may be generated by adding a predetermined bias voltage $\Delta V$ to the first slope compensation signal RAMP1 to make a peak value of the first slope compensation signal RAMP1 equal to a valley value of the second slope compensation signal RAMP2. The first slope compensation signal RAMP1 and the second slope compensation signal RAMP2 do not overlay with each other. In this case, the predetermined bias voltage $\Delta V$ may be considered as equal to the amplitude of the first slope compensation signal RAMP1.

The control circuit 200 may further comprise a buck cycle pulse width modulation module 102 and a boost cycle pulse width modulation module 103. The buck cycle pulse width modulation module 102 is configured to respectively receive the amplified difference signal Vcomp and the first current sensing signal VCS1, and to compare the first current sensing signal VCS1 with the amplified difference signal Vcomp to generate a first pulse width modulation signal PWM1. The boost cycle pulse width modulation module 103 is configured to respectively receive the amplified difference signal Vcomp and the second current sensing signal VCS2, and to compare the second current sensing signal VCS2 with the amplified difference signal Vcomp to generate a second pulse width modulation signal PWM2.

The control circuit 200 may further comprise a logic control module 104. The logic control module 104 may be configured to at least receive the first pulse width modulation signal PWM1, the second pulse width modulation signal PWM2 and a clock signal CLK for peak current control pulse width modulation mode (or an on time control signal for constant on time control mode), and further be configured to provide a first intermediate control signal Q1, a second intermediate control signal Q2, a third intermediate control signal Q3 and a fourth intermediate control signal Q4 at least based on the first pulse width modulation signal PWM1, the second pulse width modulation signal PWM2 and the clock signal CLK (or the on time control signal). The clock signal CLK may be provided by an oscillator. The on time control signal may be provided by a timing circuit. The first to fourth intermediate control signals Q1~Q4 may respectively be sent to a first driver 109, a second driver 110, a third driver 111 and a fourth driver 112. The first to fourth drivers 109~112 are configured to respectively enhance the driving capability of the first to fourth intermediate control signals Q1~Q4 to respectively output the first to fourth control signals DR1~DR4 so that the first to fourth control signals DR1~DR4 can respectively drive the first to fourth power switches SWA~SWD to fully turn on or fully turn off. In an embodiment, the first to fourth drivers 109~112 may be included in the logic control module 104 and not be shown in separate.

In accordance with an embodiment of the present invention, the first driver 109 may have a first power terminal coupled to the first bootstrap terminal BST1 to receive the first bootstrap voltage VBST1 and a second power terminal coupled to the first switching node SW1 to receive the first switching voltage VSW1. The first driver 109 may thus be configured to convert the first intermediate control signal Q1 to the first control signal DR1 with the first switching voltage VSW1 as reference low potential and the first switching voltage VSW1 plus the first bootstrap voltage VBST1 as reference high potential. Therefore, the first control signal DR1 which is used to drive the first power switch SWA has enhanced driving capability. The second driver 110 may have a first power terminal coupled to an internal supply voltage VCC and a second power terminal connected to the reference ground GND. The second driver 110 may thus be configured to convert the second intermediate control signal Q2 to the second control signal DR2 with the reference ground GND potential as reference low potential and the internal supply voltage VCC as reference high potential. The third driver 111 may have a first power terminal coupled to the internal supply voltage VCC and a second power terminal connected to the reference ground GND. The third driver 111 may thus be configured to convert the third intermediate control signal Q3 to the third control signal DR3 with the reference ground GND potential as reference low potential and the internal supply voltage VCC as reference high potential. The fourth driver 112 may have a first power terminal coupled to the second bootstrap terminal BST2 to receive the second bootstrap voltage VBST2 and a second power terminal coupled to the second switching node SW2 to receive the second switching voltage VSW2. The fourth driver 112 may thus be configured to convert the fourth intermediate control signal Q4 to the fourth control signal DR4 with the second switching voltage VSW2 as reference low potential and the second switching voltage VSW2 plus the second bootstrap voltage VBST2 as reference high potential. Therefore, the fourth control signal DR4 which is used to drive the fourth power switch SWD has enhanced driving capability.

In accordance with an embodiment of the present invention, the control circuit 200 may further comprise a pulse skipping control module 105. The pulse skipping control module 105 may be configured to receive a load indication signal indicative of the load status (e.g. normal load, heavy load or light load or no load) of the buck-boost power converter 100, and to compare the load indication signal with a pulse skipping threshold VPSM to determine whether the buck-boost power converter 100 enters into pulse skipping mode and provide a pulse skipping control signal PSM. In an embodiment, as illustrated in FIG. 3, the amplified difference signal Vcomp may be fed to the pulse skipping control module 105 as the load indication signal. If the load indication signal (Vcomp) is lower than the pulse skipping threshold VPSM, the pulse skipping control module 105 determines that the buck-boost power converter 100 is in light load or no load status and the pulse skipping control signal PSM is configured to control the buck-boost power converter 100 to enter into pulse skipping mode to reduce power consumption. In an embodiment, still refer to the illustration in FIG. 3, the pulse skipping control module 105 may comprise a pulse skipping comparator configured to receive the load indication signal and the pulse skipping threshold VPSM respectively at a first input terminal and a second input terminal and to output the pulse skipping control signal PSM at an output terminal. Those having ordinary skill in the art should understand that using the amplified difference signal Vcomp as the load indication signal is only to provide an example and not intended to be limiting, any other signals carrying load information may also be used as the load indication signal.

In accordance with an embodiment of the present invention, the control circuit 200 may further comprise a zero-cross detection module 108. The zero cross detection module 108 may be configured to determine whether the inductor current IL crosses zero based on comparing the second feedback signal Vcs with a first zero-crossing threshold VZCD1 to generate a first zero-crossing indication signal ZCD1 during the second power switch SWB or the third power switch SWC is on. If the second feedback signal Vcs reaches the first zero-crossing threshold VZCD1, the first zero-crossing indication signal ZCD1 indicates that the switching current IB flowing through the second power switch SWB or the switching current IC flowing through the third power switch SWC (i.e. the inductor current IL during the second power switch SWB or the third power switch SWC is on) crosses zero. The zero cross detection module 108 may further be configured to determine whether the inductor current IL crosses zero based on comparing a difference between the output voltage Vo and the second switching voltage VSW2 with a second zero-crossing threshold VZCD2 to generate a second zero-crossing indication signal ZCD2 during the fourth power switch SWD is on. If the difference between the output voltage Vo and the second switching voltage VSW2 reaches the second zero-crossing threshold VZCD2, the second zero-crossing indication signal ZCD2 indicates that the switching current ID flowing through the fourth power switch SWD (i.e. the inductor current IL during the fourth power switch SWD is on) crosses zero. In an exemplary embodiment as shown in FIG. 3, the zero cross detection module 108 may comprise a first zero-crossing detection comparator 1081 configured to receive the second feedback signal Vcs and the first zero-crossing threshold VZCD1 respectively at a first input terminal and a second input terminal of the first zero-crossing detection comparator 1081, and to provide the first zero-crossing indication signal ZCD1 at an output terminal of the first zero-crossing detection comparator 1081. The zero-cross detection module 108 may further comprise a second zero-crossing detection comparator 1082 and a first zero-crossing detection operational amplifier 1083. The first zero-crossing detection operational amplifier 1083 may be configured to receive the output voltage Vo (or a signal indicative of the output voltage Vo) and the second switching voltage VSW2 (or a signal indicative of the second switching voltage VSW2) respectively at a first input terminal and a second input terminal of the first zero-crossing detection amplifier 1083, and to provide a first difference signal Vd1 indicative of the difference between the output voltage Vo and the second switching voltage VSW2 at an output terminal of the first zero-crossing detection amplifier 1083. The second zero-crossing detection comparator 1082 may be configured to receive the first difference signal Vd1 and the second zero-crossing threshold VZCD2 respectively at a first input terminal and a second input terminal of the second zero-crossing detection comparator 1082, and to provide the second zero-crossing indication signal ZCD2 at an output terminal of the second zero-crossing detection comparator 1082. In an embodiment, the zero-cross detection module 108 may further comprise an "OR" logic circuit 1085 configured to receive the first zero-crossing indication signal ZCD1 and the second zero-crossing indication signal ZCD2 and to conduct "OR" logic operation to the first zero-crossing indication signal ZCD1 and the second zero-crossing indication signal ZCD2 to provide a zero-crossing indication signal ZCD. When the first zero-crossing indication signal ZCD1 indicates that the switching current IB flowing through the second power switch SWB or the switching current IC flowing through the third power switch SWC crosses zero or the second zero-crossing indication signal ZCD2 indicates that the switching current ID flowing through the fourth power switch SWD crosses zero, the zero-crossing indication signal ZCD indicates that the inductor current IL crosses zero. In an embodiment, the "OR" logic circuit 1085 may also be included in the logic control module 104 and not be shown in separate.

Figure 4:
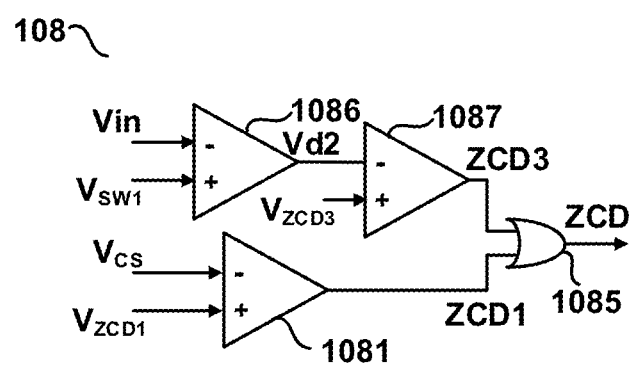
FIG. 4 illustrates a schematic diagram of zero cross detection module 108 in accordance with an embodiment of the present invention.

In accordance with an alternative embodiment of the present invention, as shown in FIG. 4, the zero-cross detection module 108 may be configured to determine whether the inductor current IL crosses zero based on comparing a difference between the input voltage Vin and the first switching voltage VSW1 with a third zero-crossing threshold VZCD3 to generate a third zero-crossing indication signal ZCD3 during the fourth power switch SWD is on. If the difference between the input voltage Vin and the first switching voltage VSW1 reaches the third zero-crossing threshold VZCD3, the third zero-crossing indication signal ZCD3 indicates that the switching current IA flowing through the first power switch SWA (i.e. the inductor current IL during the first power switch SWA is on) crosses zero. The differences between the zero-cross detection module 108 of FIG. 3 and the zero cross detection module 108 of FIG. 4 lie in replacing the second zero-crossing detection comparator 1082 and the first zero-crossing detection operational amplifier 1083 respectively with a third zero-crossing detection comparator 1086 and a second zero-crossing detection operational amplifier 1087. The third zero-crossing detection operational amplifier 1086 may be configured to receive the input voltage Vin (or a signal indicative of the input voltage Vin) and the first switching voltage VSW1 (or a signal indicative of the first switching voltage VSW1) respectively at a first input terminal and a second input terminal of the second zero-crossing detection amplifier 1086, and to provide a second difference signal Vd2 indicative of the difference between the input voltage Vin and the first switching voltage VSW1 at an output terminal of the second zero-crossing detection amplifier 1086. The third zero-crossing detection comparator 1087 may be configured to receive the second difference signal Vd2 and the third zero-crossing threshold VZCD3 respectively at a first input terminal and a second input terminal of the third zero-crossing detection comparator 1087, and to provide the third zero-crossing indication signal ZCD3 at an output terminal of the third zero-crossing detection comparator 1087. The "OR" logic circuit 1085 of FIG. 4 is configured to receive the first zero-crossing indication signal ZCD1 and the third zero-crossing indication signal ZCD3 and to conduct "OR" logic operation to the first zero-crossing indication signal ZCD1 and the third zero-crossing indication signal ZCD3 to provide the zero-crossing indication signal ZCD. When the first zero-crossing indication signal ZCD1 indicates that the switching current IB flowing through the second power switch SWB or the switching current IC flowing through the third power switch SWC crosses zero or the third zero-crossing indication signal ZCD3 indicates that the switching current IA flowing through the first power switch SWA crosses zero, the zero-crossing indication signal ZCD indicates that the inductor current IL crosses zero.

In accordance with an embodiment of the present invention, the logic control module 104 may further be configured to receive the pulse skipping control signal PSM and the zero-crossing indication signal ZCD and to control the second power switch SWB and/or the third power switch SWC based on the pulse skipping control signal PSM and the zero-crossing indication signal ZCD. In an embodiment, when the pulse skipping control signal PSM controls the buck-boost power converter 100 to enter into the pulse skipping mode and the zero-crossing indication signal ZCD indicates that the inductor current IL crosses zero, the logic control module 104 controls the second power switch SWB to turn on. Once the second power switch SWB is turned on, the first switching voltage VSW1 is pulled to the low potential (e.g. the reference ground GND potential) so that the first bootstrap capacitor CB1 can be charged to refresh the first bootstrap voltage VBST1. After the second power switch SWB is on for a short duration, the second switching voltage VSW2 can also be pulled to the low (e.g. the reference ground GND potential) since the second switching voltage VSW2 can be discharged through the inductive energy storage component Lo and the second power switch SWB. In consequence, the second bootstrap capacitor CB2 can be charged to refresh the second bootstrap voltage VBST2. In an embodiment, when the pulse skipping control signal PSM controls the buck-boost power converter 100 to enter into the pulse skipping mode and the zero-crossing indication signal ZCD indicates that the inductor current IL crosses zero, the logic control module 104 controls the third power switch SWC to turn on. Once the third power switch SWC is turned on, the second switching voltage VSW2 is pulled to the low potential (e.g. the reference ground GND potential) so that the second bootstrap capacitor CB2 can be charged to refresh the second bootstrap voltage VBST2. After the third power switch SWC is on for a short duration, the first switching voltage VSW1 can also be pulled to the low (e.g. the reference ground GND potential) since the first switching voltage VSW1 can be discharged through the inductive energy storage component Lo and the third power switch SWC. In consequence, the first bootstrap capacitor CB1 can be charged to refresh the first bootstrap voltage VBST1. In an embodiment, when the pulse skipping control signal PSM controls the buck-boost power converter 100 to enter into the pulse skipping mode and the zero-crossing indication signal ZCD indicates that the inductor current IL crosses zero, the logic control module 104 controls both the second power switch SWB and the third power switch SWC to turn on. In response, both the first switching voltage VSW1 and the second switching voltage VSW2 are pulled to the low potential (e.g. the reference ground GND potential) so that the first bootstrap capacitor CB1 and the second bootstrap capacitor CB2 can be charged promptly to refresh the first bootstrap voltage VBST1 and the second bootstrap voltage VBST2.

In an embodiment, the logic control module 104 may include an "AND" logic circuit to conduct "AND" logic operation to the pulse skipping control signal PSM and the zero-crossing indication signal ZCD to provide an AND logic signal and control the second power switch SWB and/or the third power switch SWC based on the AND logic signal. One of ordinary skill in the art would understand that the logic control module 104 may adopt various logic circuits to control the second power switch SWB and/or the third power switch SWC to turn on when the buck-boost power converter 100 is in the pulse skipping mode and the inductor current IL crosses zero, not just confined to the "AND" logic circuit of this example.

Figure 5:
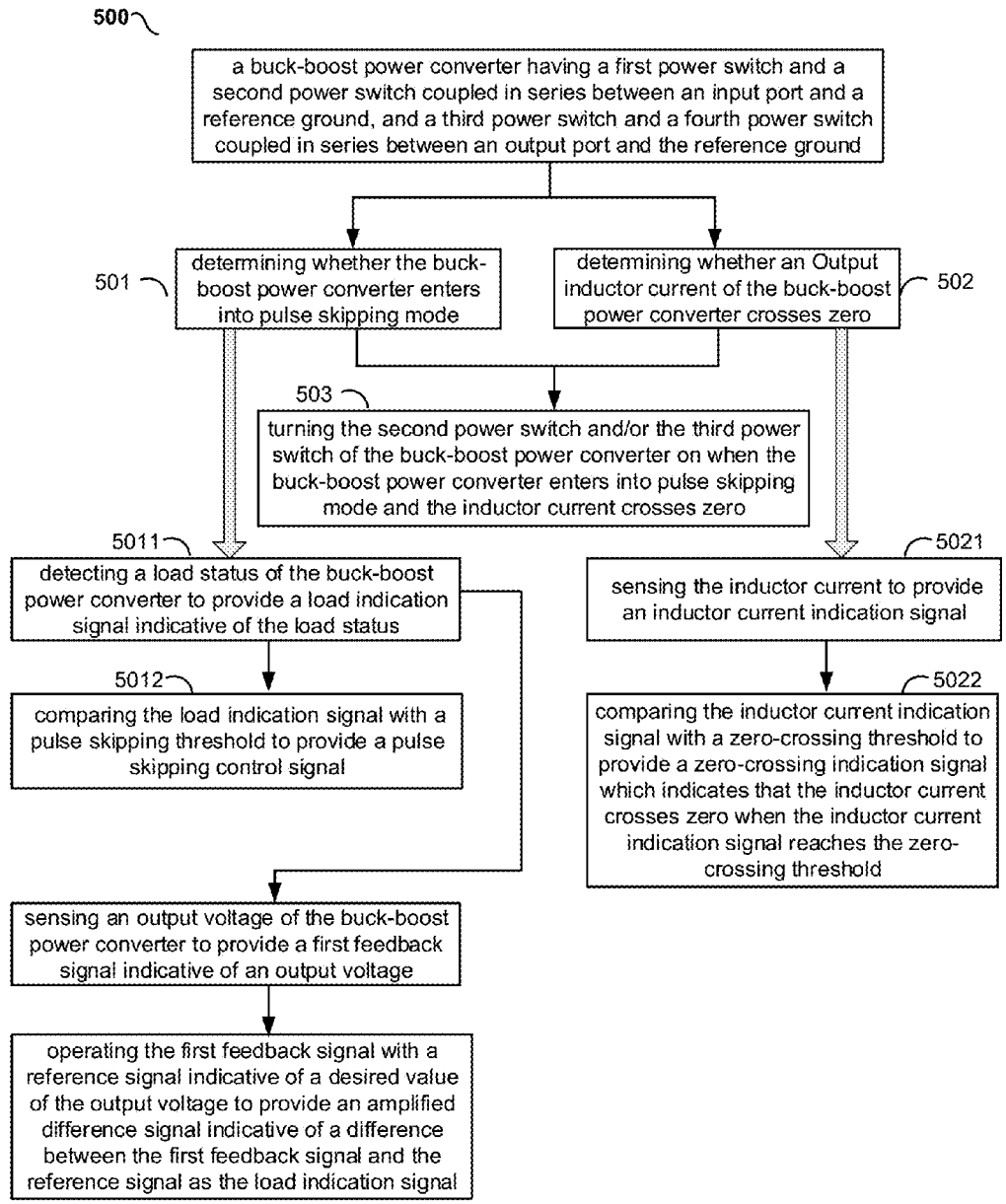
FIG. 5 illustrates a control method 500 for controlling a buck-boost power converter in accordance with an embodiment of the present invention.

FIG. 5 illustrates a control method 500 for controlling a buck-boost power converter (e.g. the buck-boost power converter 200 as shown in FIG. 3). The buck-boost power converter may comprise a first power switch and a second power switch coupled in series between an input port and a reference ground, and a third power switch and a fourth power switch coupled in series between an output port and the reference ground, wherein the first power switch and the second power switch have a common connection referred to as a first switching node, and the third power switch and the fourth power switch have a common connection referred to as a second switching node, and wherein an output inductive energy storage component (e.g. the inductive energy storage component Lo as shown in FIG. 3) is coupled between the first switching node and the second switching node. The method 500 may comprise: step 501, determining whether the buck-boost power converter enters into pulse skipping mode; step 502, determining whether an inductor current through the output inductive energy storage component of the buck-boost power converter crosses zero; and step 503, turning the second power switch and/or the third power switch of the buck-boost power converter on when the buck-boost power converter enters into pulse skipping mode and the inductor current crosses zero.

In an embodiment, at step 501, determining whether the buck-boost power converter enters into pulse skipping mode may comprise: step 5011, detecting a load status of the buck-boost power converter and providing a load indication signal indicative of the load status; and step 5012 comparing the load indication signal with a pulse skipping threshold to provide a pulse skipping control signal, wherein when the load indication signal is lower than the pulse skipping threshold, the pulse skipping control signal controls the buck-boost power converter to enter into pulse skipping mode. In an embodiment, step 5011 may comprise: sensing an output voltage of the buck-boost power converter to provide a first feedback signal indicative of the output voltage; and operating the first feedback signal with a reference signal indicative of a desired value of the output voltage to provide an amplified difference signal indicative of a difference between the first feedback signal and the reference signal as the load indication signal.

In an embodiment, at step 502, determining whether the inductor current crosses zero may comprise: step 5021, sensing the inductor current to provide an inductor current indication signal; and step 5022, comparing the inductor current indication signal with a zero-crossing threshold to provide a zero-crossing indication signal which indicates that the inductor current crosses zero when the inductor current indication signal reaches the zero-crossing threshold. In an embodiment, the inductor current indication signal may comprise a second feedback signal indicative of a switching current flowing through the second power switch or a switching current flowing through the third power switch and a first difference signal indicative of a difference between the output voltage and a second switching voltage at the second switching node. The zero-crossing threshold may comprise a first zero-crossing threshold and a second zero-crossing threshold. Comparing the inductor current indication signal with the zero-crossing threshold comprises comparing the second feedback signal and the first difference signal respectively with the first zero-crossing threshold and the second zero-crossing threshold to respectively generate a first zero-crossing indication signal and a second zero-crossing indication signal, wherein the first zero-crossing indication signal indicates that the output inductor current crosses zero when the second feedback signal reaches the first zero-crossing threshold, and wherein the second zero-crossing indication signal indicates that the output inductor current crosses zero when the first difference signal reaches the second zero-crossing threshold. The zero-crossing indication signal thus comprises the first zero-crossing indication signal and the second zero-crossing indication signal. In an alternative embodiment, the inductor current indication signal may comprise the second feedback signal and a second difference signal indicative of a difference between the output voltage and a first switching voltage at the first switching node. The zero-crossing threshold may comprise the first zero-crossing threshold and a third zero-crossing threshold. Comparing the inductor current indication signal with the zero-crossing threshold comprises comparing the second feedback signal and the second difference signal respectively with the first zero-crossing threshold and the third zero-crossing threshold to respectively generate the first zero-crossing indication signal and a third zero-crossing indication signal, wherein the first zero-crossing indication signal indicates that the output inductor current crosses zero when the second feedback signal reaches the first zero-crossing threshold, and wherein the third zero-crossing indication signal indicates that the output inductor current crosses zero when the second difference signal reaches the third zero-crossing threshold. The zero-crossing indication signal thus comprises the first zero-crossing indication signal and the third zero-crossing indication signal.

The above descriptions to the buck-boost power converter 100 and the control circuit 200 according to various embodiments of the present invention are exemplary and not intended to be limiting. One of ordinary skill in the art should understand that various modifications and variations can be made. Those skilled in the art should also understand that the steps described in the control method 500 may not be implemented in orders of the step numbers, but may be implemented in different orders or simultaneously and are not limited to the embodiments described.

From the foregoing, it will be appreciated that specific embodiments of the present invention have been described herein for purposes of illustration, but that various modifications may be made without deviating from the spirit and scope of various embodiments of the present invention. Many of the elements of one embodiment may be combined with other embodiments in addition to or in lieu of the elements of the other embodiments. Accordingly, the present invention is not limited except as by the appended claims.

What is claimed is:

1. A control circuit for a buck-boost power converter having a first power switch and a second power switch coupled in series between an input port and a reference ground and a third power switch and a fourth power switch coupled in series between an output port and the reference ground, comprising:
a logic control module configured to receive a pulse skipping control signal and a zero-crossing indication signal, wherein when the pulse skipping control signal controls the buck-boost power converter to enter into a pulse skipping mode and the zero-crossing indication signal indicates that an output inductor current of the buck-boost power converter crosses zero, the logic control module is configured to control the second power switch to turn on or to control the third power switch to turn on or to control both the second power switch and the third power switch to turn on;
a pulse skipping control module configured to receive a load indication signal indicative of the load status of the buck-boost power converter, and to compare the load indication signal with a pulse skipping threshold to provide the pulse skipping control signal, wherein the pulse skipping control signal is configured to control the buck-boost power converter to enter into the pulse skipping mode when the load indication signal is lower than the pulse skipping threshold; and
a zero cross detection module configured to compare an inductor current indication signal indicative of the output inductor current with a zero-crossing threshold to provide the zero-crossing indication signal, wherein the zero-crossing indication signal indicates that the output inductor current crosses zero when the inductor current indication signal reaches the zero-crossing threshold.

2. The control circuit of claim 1, wherein the pulse skipping control module comprises:
a pulse skipping comparator configured to receive the load indication signal and the pulse skipping threshold respectively at a first input terminal and a second input terminal of the pulse skipping comparator and to output the pulse skipping control signal at an output terminal of the pulse skipping comparator.

3. The control circuit of claim 1, further comprising:
a system operational amplifier configured to receive a first feedback signal indicative of an output voltage of the buck-boost power converter and a reference signal, and further configured to conduct operation to the first feedback signal and the reference signal to provide an amplified difference signal indicative of a difference between the first feedback signal and the reference signal, wherein
the amplified difference signal is fed to the pulse skipping control module as the load indication signal.

4. The control circuit of claim 1, wherein the inductor current indication signal comprises a second feedback signal indicative of a switching current flowing through the second power switch or a switching current flowing through the third power switch, and wherein the zero-crossing threshold comprises a first zero-crossing threshold, and wherein the zero cross detection module is configured to compare the second feedback signal with the first zero-crossing threshold to generate a first zero-crossing indication signal, and wherein the first zero-crossing indication signal indicates that the output inductor current crosses zero when the second feedback signal reaches the first zero-crossing threshold.

5. The control circuit of claim 4, wherein the inductor current indication signal further comprises a first difference signal indicative of a difference between an output voltage of the buck-boost power converter and a switching voltage at the common connection of the third power switch and the fourth power switch, and wherein the zero-crossing threshold further comprises a second zero-crossing threshold, and wherein the zero cross detection module is further configured to compare the first difference signal with the second zero-crossing threshold to generate a second zero-crossing indication signal, and wherein the second zero-crossing indication signal indicates that the output inductor current crosses zero when the first difference signal reaches the second zero-crossing threshold, and wherein the zero-crossing indication signal comprises the first zero-crossing indication signal and the second zero-crossing indication signal.

6. The control circuit of claim 4, wherein the inductor current indication signal further comprises a second difference signal indicative of a difference between an output voltage of the buck-boost power converter and a switching voltage at the common connection of the first power switch and the second power switch, and wherein the zero-crossing threshold further comprises a third zero-crossing threshold, and wherein the zero cross detection module is further configured to compare the first difference signal with the third zero-crossing threshold to generate a third zero-crossing indication signal, and wherein the third zero-crossing indication signal indicates that the output inductor current crosses zero when the second difference signal reaches the third zero-crossing threshold, and wherein the zero-crossing indication signal comprises the first zero-crossing indication signal and the third zero-crossing indication signal.

7. The control circuit of claim 1, wherein the zero-cross detection module comprises:
a first zero-crossing detection comparator configured to receive a second feedback signal indicative of a switching current flowing through the second power switch or a switching current flowing through the third power switch and a first zero-crossing threshold respectively at a first input terminal and a second input terminal of the first zero-crossing detection comparator, and to provide a first zero-crossing indication signal at an output terminal of the first zero-crossing detection comparator, wherein the first zero-crossing indication signal indicates that the output inductor current crosses zero when the second feedback signal reaches the first zero-crossing threshold.

8. The control circuit of claim 7, wherein the zero-cross detection module further comprises:
a first zero-crossing detection operational amplifier configured to receive a signal indicative of an output voltage of the buck-boost power converter and a signal indicative of a switching voltage at the common connection of the third power switch and the fourth power switch respectively at a first input terminal and a second input terminal of the first zero-crossing detection amplifier, and to provide a first difference signal indicative of a difference between the output voltage and the switching voltage at the common connection of the third power switch and the fourth power switch at an output terminal of the first zero-crossing detection amplifier; and a second zero-crossing detection comparator configured to receive the first difference signal and a second zero-crossing threshold respectively at a first input terminal and a second input terminal of the second zero-crossing detection comparator, and to provide a second zero-crossing indication signal at an output terminal of the second zero-crossing detection comparator, wherein the second zero-crossing indication signal indicates that the output inductor current crosses zero when the first difference signal reaches the second zero-crossing threshold; and wherein the zero-crossing indication signal comprises the first zero-crossing indication signal and the second zero-crossing indication signal.

9. The control circuit of claim 7, wherein the zero-cross detection module further comprises:

a second zero-crossing detection operational amplifier configured to receive a signal indicative of an input voltage of the buck-boost power converter and a signal indicative of a switching voltage at the common connection of the first power switch and the second power switch respectively at a first input terminal and a second input terminal of the second zero-crossing detection amplifier, and to provide a second difference signal indicative of a difference between the input voltage and the switching voltage at the common connection of the first power switch and the second power switch at an output terminal of the second zero-crossing detection amplifier; and a third zero-crossing detection comparator configured to receive the second difference signal and a third zero-crossing threshold respectively at a first input terminal and a second input terminal of the third zero-crossing detection comparator, and to provide a third zero-crossing indication signal at an output terminal of the third zero-crossing detection comparator, wherein the third zero-crossing indication signal indicates that the output inductor current crosses zero when the second difference signal reaches the third zero-crossing threshold; and wherein the zero-crossing indication signal comprises the first zero-crossing indication signal and the third zero-crossing indication signal.

10. A method for controlling a buck-boost power converter having a first power switch and a second power switch coupled in series between an input port and a reference ground and a third power switch and a fourth power switch coupled in series between an output port and the reference ground, comprising:

determining whether the buck-boost power converter enters into a pulse skipping mode by detecting a load status of the buck-boost power converter to provide a load indication signal indicative of the load status and comparing the load indication signal with a pulse skipping threshold to provide a pulse skipping control signal, wherein when the load indication signal is lower than the pulse skipping threshold, the pulse skipping control signal controls the buck-boost power converter to enter into the pulse skipping mode;

determining whether an output inductor current of the buck-boost power converter crosses zero; and turning the second power switch and/or the third power switch on when the buck-boost power converter enters into the pulse skipping mode and the output inductor current crosses zero.

11. The method of claim 10, wherein detecting the load status of the buck-boost power converter and provide the load indication signal comprises:

sensing an output voltage of the buck-boost power converter to provide a first feedback signal indicative of the output voltage; and operating the first feedback signal with a reference signal indicative of a desired value of the output voltage to provide an amplified difference signal indicative of a difference between the first feedback signal and the reference signal as the load indication signal.

12. The method of claim 10, wherein determining whether the output inductor current crosses zero comprises:

sensing the output inductor current to provide an inductor current indication signal; and comparing the inductor current indication signal with a zero-crossing threshold to provide a zero-crossing indication signal, wherein the zero-crossing indication signal indicates that the output inductor current crosses zero when the inductor current indication signal reaches the zero-crossing threshold.

13. The method of claim 10, wherein determining whether the output inductor current crosses zero comprises:

sensing a switching current flowing through the second power switch or a switching current flowing through the third power switch to provide a second feedback signal; and comparing the second feedback signal with a first zero-crossing threshold to provide a first zero-crossing indication signal, wherein the first zero-crossing indication signal indicates that the output inductor current crosses zero when the second feedback signal reaches the first zero-crossing threshold.

14. The method of claim 13, wherein determining whether the output inductor current crosses zero further comprises:

generating a first difference signal indicative of a difference between an output voltage of the buck-boost power converter and a switching voltage at a common connection of the third power switch and the fourth power switch; and comparing the first difference signal with a second zero-crossing threshold to provide a second zero-crossing indication signal, wherein the second zero-crossing indication signal indicates that the output inductor current crosses zero when the first difference signal reaches the second zero-crossing threshold.

15. The method of claim 13, wherein determining whether the output inductor current crosses zero further comprises:

generating a second difference signal indicative of a difference between an input voltage of the buck-boost power converter and a switching voltage at a common connection of the first power switch and the second power switch; and comparing the second difference signal with a third zero-crossing threshold to provide a third zero-crossing indication signal, wherein the third zero-crossing indication signal indicates that the output inductor current crosses zero when the second difference signal reaches the third zero-crossing threshold.

* * * * *